United States Patent [19]
Saito et al.

[11] Patent Number: 6,150,045
[45] Date of Patent: Nov. 21, 2000

[54] SPIN-VALVE TYPE MAGNETORESISTIVE THIN FILM ELEMENT AND ITS MANUFACTURING METHOD

[75] Inventors: Masamichi Saito; Toshihiro Kuriyama, both of Niigata-ken, Japan

[73] Assignee: Alps Electric Co., Ltd., Tokyo, Japan

[21] Appl. No.: 09/153,923

[22] Filed: Sep. 16, 1998

[30] Foreign Application Priority Data

Sep. 17, 1997 [JP] Japan .................................. 9-251875

[51] Int. Cl.$^7$ ................................................. G11B 5/66
[52] U.S. Cl. ................ 428/692; 428/694 R; 428/694 T; 428/900; 427/128; 427/130; 427/131; 360/113; 360/126; 338/32 R; 324/252
[58] Field of Search ........................ 428/692, 694 T, 428/900; 360/113, 126; 324/252; 427/130, 131, 128; 338/32 R

[56] References Cited

U.S. PATENT DOCUMENTS

| | | | |
|---|---|---|---|
| 5,018,037 | 5/1991 | Krounbi et al. | 360/327.31 |
| 5,079,035 | 1/1992 | Krounbi et al. | 427/130 |
| 5,159,513 | 10/1992 | Dieny et al. | 360/324.1 |
| 5,206,590 | 4/1993 | Dieny et al. | 324/252 |
| 5,373,238 | 12/1994 | McGuire et al. | 324/252 |
| 5,869,963 | 2/1999 | Saito | 324/252 |
| 5,972,420 | 10/1999 | Saito | 427/130 |

*Primary Examiner*—Leszek Kiliman
*Attorney, Agent, or Firm*—Brinks Hofer Gilson & Lione

[57] ABSTRACT

The pinned magnetic layer 2 is composed of a track width region 2' and a dead region 2", the track width region 2' being formed at a spaced apart relation to the bias region 5. Accordingly, magnetization of the track width region 2' is not so strongly affected by the bias region 5, thereby magnetization is fixed along the Y-direction at almost entire region of the track width region 2'. Therefore, the track width region 2' and the free magnetic region are in a crossing relation with each other giving a proper asymmetry in the entire region of the track width region 2'.

14 Claims, 5 Drawing Sheets

SPIN-VALVE TYPE MAGNETORESISTIVE THIN FILM ELEMENT AND ITS MANUFACTURING METHOD

BACKGROUND OF THE INVENTION

1. Field of the Invention

The present invention relates to a so-called spin-valve type thin film element in which electric resistance is varied by the relation between the magnetization direction of a pinned magnetic layer and the magnetization direction of a free magnetic layer being affected by external magnetic field, especially to the spin-valve type thin film element in which the relative angle between magnetization of the pinned magnetic layer and magnetization of the free magnetic layer is made to be properly adjustable, and to a method for manufacturing the same.

2. Description of the Related Art

Figure 6:
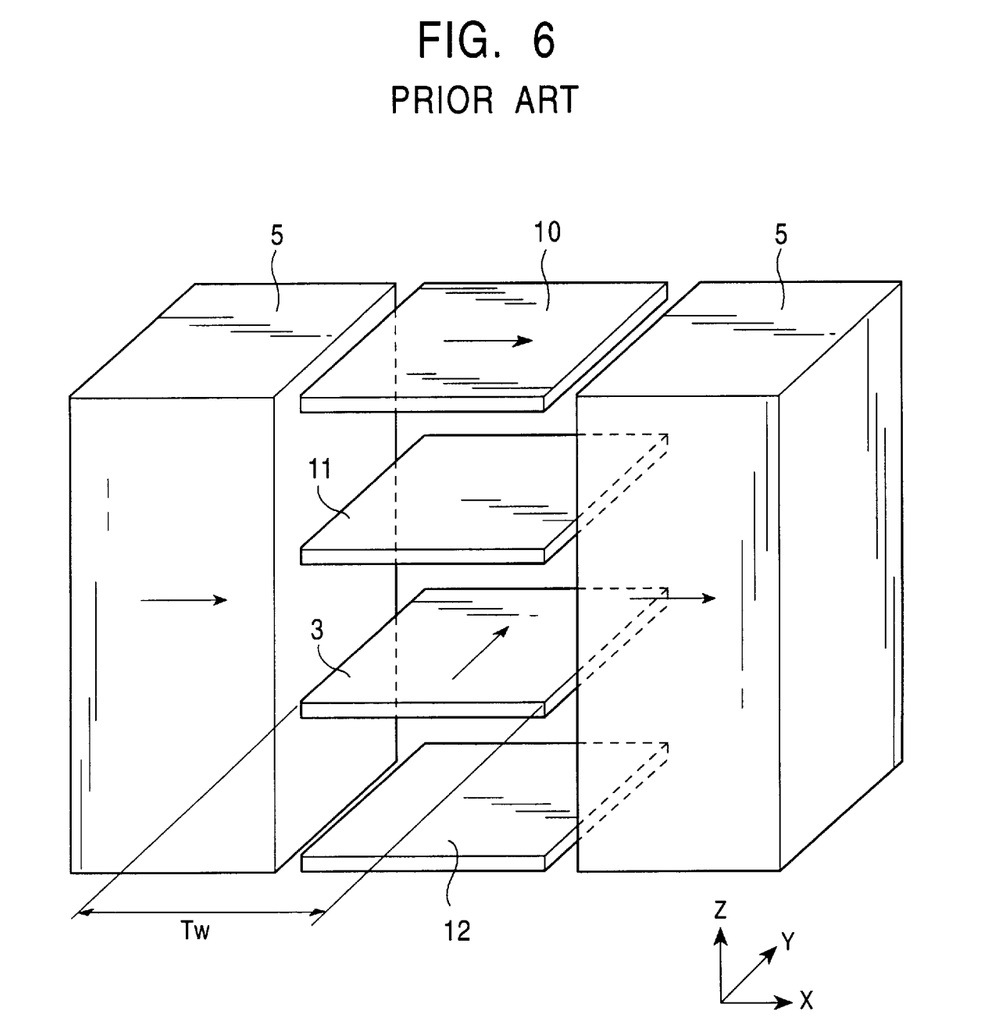
FIG. 6 is an illustrative drawing showing the structure of the conventional spin-valve type thin film element.

FIG. 6 is a schematic drawing of the conventional structure of the spin-valve type thin film element.

The spin-valve type thin film element is a kind of GMR (giant magnetoresistive) element taking advantage of giant magnetoresistance effect for sensing recording magnetic filed from recording media such as a hard disk.

A free magnetic layer 10, a non-magnetic conductive layer 11, a fixed magnetic layer (a pinned magnetic layer) 3 and an anti-ferromagnetic layer 12 are layered in this spin-valve type thin film element, on both sides of which hard bias layers 5, 5 are formed.

Usually, a Fe—Mn (iron-manganese) alloy film or Ni—Mn (nickel-manganese) alloy film is used for the anti-ferromagnetic layer 12, a Ni—Fe (nickel-iron) alloy film is used for the pinned magnetic layer 3 and free magnetic layer 10, a Cu (copper) film is used for the non-magnetic conductive layer 11 and a Co—Pt (cobalt-platinum) alloy is used for the hard bias layers 5, 5.

As shown in FIG. 6, magnetization of the pinned magnetic layer 3 is put into a single magnetic domain state along the Y-direction (the direction of leakage magnetic field from the recording medium; the height direction) due to exchange anisotropic magnetic field with the anti-ferromagnetic layer 12 while magnetization of the pinned magnetic layer 3 is aligned along the X-direction by being affected by the bias magnetic field from the hard bias layers 5, 5.

Detecting current (sensing current) is imparted to the pinned magnetic layer 3, non-magnetic conductive layer 11 and free magnetic layer 10 from the conductive layer (not shown) formed on the hard bias layers 5, 5. While the scanning direction of the recording medium such as a hard disk is along the Z-direction, magnetization of the free magnetic layer 10 turns to the Y-direction from the X-direction when a leakage magnetic field is applied along the Y-direction from the recording medium. Electric resistance is changed depending on the relation between fluctuation of the magnetization direction in this free magnetic layer 10 and pinned magnetization direction of the pinned magnetic layer 3, sensing the leakage magnetic field from the recording medium due to voltage variation based on this electric resistance change.

The method for manufacturing the spin-valve type thin film element shown in FIG. 6 will be described below.

Firstly, the free magnetic layer 10, non-magnetic conductive layer 11, pinned magnetic layer 3 and anti-ferromagnetic layer 12 are successively layered. When the anti-ferromagnetic layer 12 is formed of the Fe—Mn alloy, the film forming step is carried out in a magnetic field along the Y-direction shown in the drawing. When the anti-ferromagnetic layer 12 is formed of the Ni—Mn alloy, on the other hand, the layer is annealed in a magnetic field along the Y-direction after forming the film.

An exchange anisotropic magnetic field (Hex) is generated at the interface between the anti-ferromagnetic layer 12 and pinned magnetic layer 3, magnetization of the anti-ferromagnetic layer 12 being fixed after being put into a single magnetic domain state along the Y-direction shown in the drawing.

Then, the layer structure is patterned so that the width of each layer of the anti-ferromagnetic layer 12, pinned magnetic layer 3, non-magnetic conductive layer 11 and free magnetic layer 10 is to be approximately the same as the track width Tw, followed by forming the hard bias layers 5, 5 on both sides of the four layers from the anti-ferromagnetic layer 12 to the free magnetic layer 10.

Once the hard bias layers 5, 5 are magnetized along the X-direction shown in the drawing, magnetization of the free magnetic layer 10 is aligned along the X-direction due to the bias magnetic field along the X-direction from the hard bias layer, setting the relative angle between magnetization of the free magnetic layer 10 and magnetization of the pinned magnetic layer 3 to about 90°.

However, some problems as described below arise in the conventional spin-valve type thin film element shown in FIG. 6.

Figure 7:
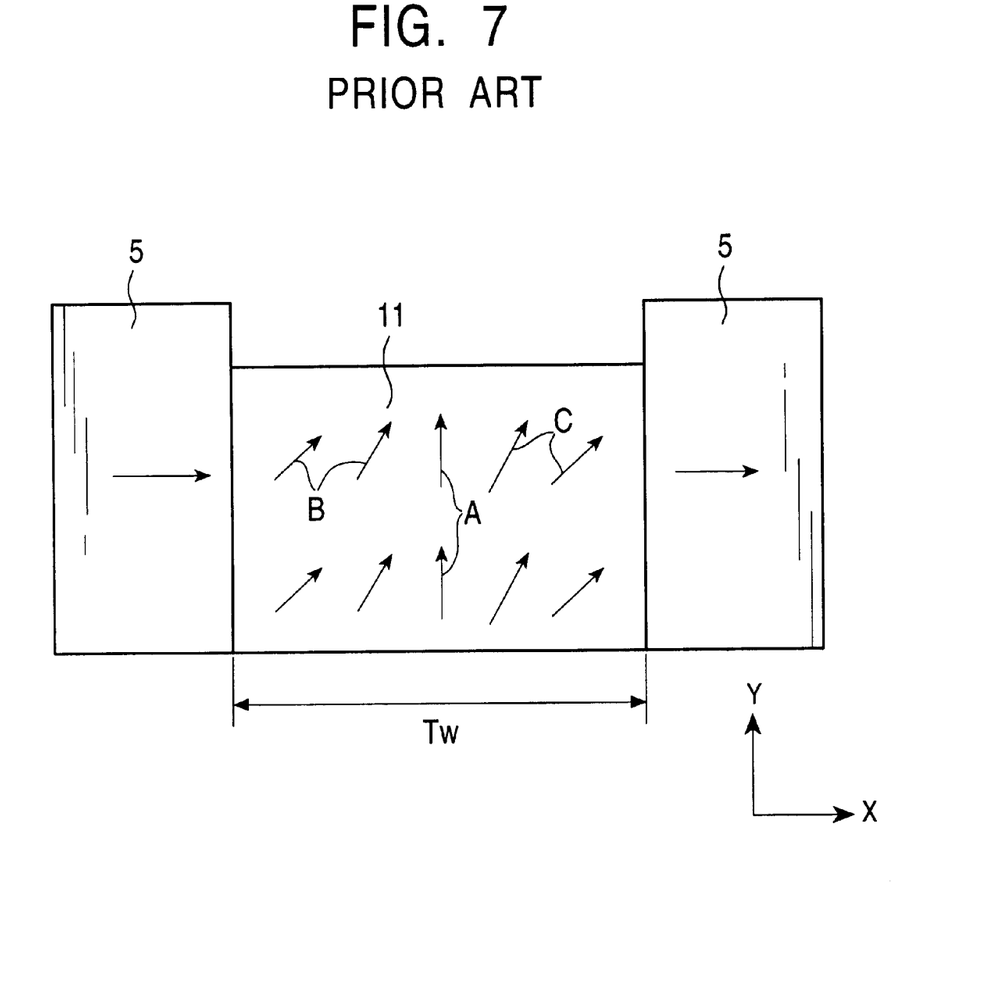
FIG. 7 is an illustrative drawing showing magnetization state of each layer of the pinned magnetic layer and hard bias layer in FIG. 6 viewed from just above the layers.

While magnetization of the pinned magnetic layer 3 is fixed by being put into a single magnetic domain state as described previously, the hard bias layers 5, 5 magnetized along the X-direction are provided on both sides of the pinned magnetic layer 3. Therefore, magnetization at both sides of the pinned magnetic layer 3 is especially affected by the bias magnetic field from the hard bias layers 5, 5, making it difficult to be fixed along the Y-direction shown in the drawing. FIG. 7 is a schematic drawing illustrating the state. FIG. 7 is a top view of the pinned magnetic layer 3 and hard bias layers 5, 5.

Magnetization A at the central region of the pinned magnetic layer 3 is directed toward the Y-direction as shown in FIG. 7 because it is hardly affected by the influence of the bias magnetic field along the X-direction of the hard bias layers 5, 5 owing to a spaced apart relation to the hard bias layers 5, 5.

On the contrary, magnetization B and C at both end regions of the pinned magnetic layer 3 are so strongly affected by the bias magnetic field along the X-direction from the hard bias layers 5, 5 that magnetization is pinned by being inclined toward the X-direction from the Y-direction.

Accordingly, magnetization of the pinned magnetic layer 3 is not orthogonal to magnetization of the free magnetic layer 10 because the former is not pinned along the Y-direction in the conventional spin-valve type thin film element, making it impossible to obtain desirable micro-track asymmetry in the vicinity of both ends. Micro-track asymmetry as used herein refers to horizontal asymmetry of the reproduced output waveform measured at a minuter track width than the actual track width, giving a horizontally symmetric regenerated output waveform when the micro-track asymmetry is close to zero.

When the degree of micro-track asymmetry is increased to deteriorate it, on the contrary, sensing of the track position can not be accurately carried out to readily cause a servo-error.

Moreover, because all magnetization of the pinned magnetic layer within the track width Tw is not fixed along the Y-direction, magnetic barriers are created at the site having different magnetization direction to easily generate Barkhausen noise.

SUMMARY OF THE INVENTION

Accordingly, the object of the present invention for solving the problems in the prior art as hitherto described is to provide a spin-valve type thin film element being able to improve micro-track asymmetry along with diminishing Barkhausen noise by setting the relative angle between magnetization in the track width region of the pinned magnetic layer and magnetization of the free magnetic layer to about 90°, and a method for manufacturing the same.

In a first aspect, the present invention provides a spin-valve type thin film element having an anti-ferromagnetic layer, a pinned magnetic layer formed in close contact with this anti-ferromagnetic layer in which the magnetization direction is fixed by an exchange anisotropic magnetic field with the anti-ferromagnetic layer and a free magnetic layer formed over and/or under the pinned magnetic layer via a non-magnetic conductive layer, additionally provided with a bias layer for aligning magnetization direction of the free magnetic layer along the direction to cross with magnetization direction of the pinned magnetic layer and a conductive layer for imparting a sense current to the pinned magnetic layer and non-magnetic conductive layer, wherein the pinned magnetic layer is constructed by a track width region having an approximately the same width as the track width Tw and a dead region positioned at both side of the track width region and having an width dimension of T1, magnetization in the track width region being fixed along the direction to cross with magnetization direction of the free magnetic layer and magnetization in the dead region being fixed along the same direction as the magnetization direction of the free magnetic layer.

It is preferable that the width dimension T1 of the dead region is about 0.5 μm.

It is also preferable that the anti-ferromagnetic layer is formed of a Pt—Mn alloy. The Pt—Mn alloy has excellent properties as an anti-ferromagnetic material such that it can generate a larger exchange anisotropic magnetic field, has a higher blocking temperature and better corrosion resistance than the Fe—Mn alloy conventionally used for the anti-ferromagnetic layer. Once the anti-ferromagnetic layer is formed of the Pt—Mn alloy, no exchange anisotropic magnetic field is generated at the interface between the anti-ferromagnetic layer and pinned magnetic layer so long as any annealing treatment is not applied.

A Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr or Co) may be used instead of the Pt—Mn alloy for the anti-ferromagnetic layer according to the present invention.

The method for manufacturing the spin-valve type thin film element according to the present invention comprises the steps of:

forming a multi-layer film comprising an anti-ferromagnetic layer, pinned magnetic layer, non-magnetic conductive layer and free magnetic layer from the bottom in this order;

Patterning the multi-layer film so that the width dimension of the multi-layer film becomes longer than the track width Tw to form a track region having an approximately the same width dimension as the track width Tw of the pinned magnetic layer and a dead region positioned at both sides of the track width region and having a width dimension of T1;

forming bias layers on both sides of the multi-layer film and magnetizing the bias layer along the tack width direction; and fixing magnetization in the track width region of the pinned magnetic layer along the leakage magnetic field direction from a recording medium after annealing in a magnetic field along the leakage magnetic field direction from the recording medium, thereby fixing magnetization in the dead region along the track width direction.

A free magnetic layer, non-magnetic conductive layer, pinned magnetic layer and anti-ferromagnetic layer may be layered from the bottom in this order in the multi-layer film according to the present invention.

While it is preferable that the anti-ferromagnetic layer is formed of a Pt—Mn alloy, Pd—Mn alloy, Ru—Mn alloy, Ir—Mn alloy, Os—Mn alloy, Rh—Mn alloy or a Pt—Mn—X alloy (X=Ni, Pd, Rh, Ru, Ir, Cr and Co) may be used for the anti-ferromagnetic layer instead of the Pt—Mn alloy.

The width dimension of the pinned magnetic layer is formed longer than the tack width Tw in the present invention to properly fix magnetization in the track width region along the direction to cross with magnetization direction of the free magnetic layer.

Although the pinned magnetic layer was conventionally formed with the same width dimension as the track width Tw, magnetization at both ends of the pinned magnetic layer is inclined at a certain angle by being affected by the bias layer in the configuration as described above, causing a problem that the relative angle between magnetization of the pinned magnetic layer at both ends of the track width Tw and magnetization of the free magnetic layer can not be set to 90°.

Accordingly, the four layers comprising the anti-ferromagnetic layer, pinned magnetic layer, non-magnetic conductive layer and free magnetic layer are patterned so that the width dimension of the pinned magnetic layer becomes longer than the tack width Tw, providing a dead region with an width dimension of T1 at both sides of the track width region of the pinned magnetic layer.

A track width region 2' of the pinned magnetic layer 2 is formed at a spaced apart position from the bias region 5, 5 to diminish the effect of the bias magnetic field from the bias layers 5, 5 to the track width region 2' as weak as possible. This enables magnetization D of the track width region 2' to be properly fixed along the Y-direction by annealing the track width region 2' in the magnetic field along the Y-direction (the leakage magnetization direction from the recording medium; the height direction), thereby making it possible to set the relative angle between magnetization D at the track width region 2' of the pinned magnetic layer 2 and magnetization of the free magnetic layer 4 (see FIG. 1 and FIG. 2) aligned along the X-direction (track width direction) to 90° or to an angle close to this angle.

Figure 3:
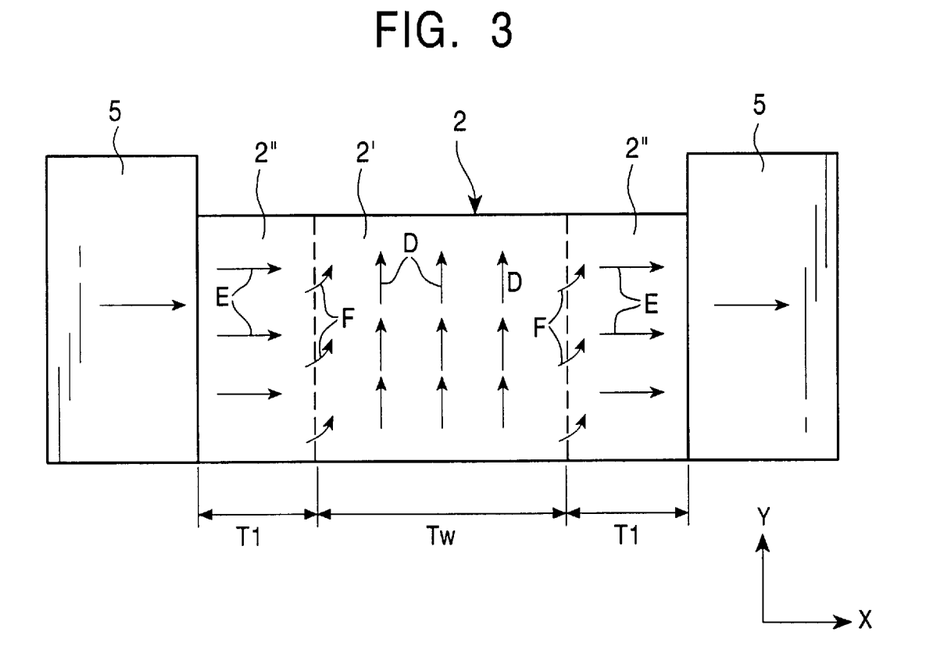
FIG. 3 is an illustrative drawing showing the magnetization state of the pinned magnetic layer and hard bias layer shown in FIG. 2 viewed from just above the layers.

Magnetization E of the dead region 2" provided at both sides of the pinned magnetic layer 2 is aligned along the same direction as the magnetization direction of the free magnetic layer 4 in the present invention as shown in FIG. 3. Magnetization E of the dead region 2" is fixed along the same direction as the magnetization direction of free magnetic layer 4 in order to make reproduction sensitivity at the portion other than the track width region 2' dull to obtain reproduction output signals from only the track width region 2'.

However, it is preferable that an anti-ferromagnetic material that is able to generate an exchange anisotropic magnetic field at the interface of the pinned magnetic layer 2 as a result of a heat treatment is selected for fixing magnetization E of the dead region 2" along the X-direction shown in the drawing. Moreover, the order of the conventional production steps should be changed.

As hitherto described, the annealing step in the magnetic field is carried out in the present invention after forming and magnetizing the bias layer.

In the first step, bias layers are formed on both sides of the multi-layer film followed by magnetizing the bias layer along the track width direction after patterning a multi-layer film comprising an anti-ferromagnetic layer, a pinned magnetic layer, a non-magnetic conductive layer and a free magnetic layer so that its width dimension becomes longer than the track width Tw.

No exchange anisotropic magnetic field is generated at the interface between the anti-ferromagnetic layer and pinned magnetic layer since any heat treatment has not been applied in the step described above. However, magnetization of the dead region positioned at both sides of the track width region of the pinned magnetic layer can be tightly aligned along the track width direction due to a strong anti-ferromagnetic coupling with the bias layer. On the contrary, magnetization of the track width region of the pinned magnetic layer in spaced apart relation to the bias region is weakly aligned along the track width direction because the track width region is not so strongly affected by the bias magnetic field from the bias layer as the dead region does.

When the element is annealed in a magnetic field along the Y-direction in the condition as described above, an exchange anisotropic magnetic field is generated at the interface between the anti-ferromagnetic layer 1 (see FIG. 1 and FIG. 2) and pinned magnetic layer, magnetization D of the track width region 2' of the pinned magnetic layer 2 that is strongly affected by the magnetic field along the Y-direction being properly fixed approximately along the Y-direction.

The foregoing ferromagnetic coupling functions stronger than the magnetic field along the Y-direction in magnetization E of the dead region 2" tightly aligned along the X-direction (the track width direction) due to a ferromagnetic coupling with the bias layer 5. Therefore, the exchange anisotropic magnetic field generating at the interface between the dead region 2" and ferromagnetic layer 1 is directed toward the X-direction, thereby magnetization E of the dead region 2" is fixed approximately along the X-direction by being put into a single magnetic domain state.

As hitherto described, since magnetization of the dead region positioned at both sides of the pinned magnetic layer is aligned along the same direction as the magnetization direction of the free magnetic field, it is made possible to obtain regeneration output signals only from the track width region by making reproduction sensitivity from the portions other than the track width region dull.

Moreover, since magnetization of the track width region of the pinned magnetic layer can be approximately aligned along the direction to cross with the magnetization direction of the free magnetic layer, a proper asymmetry can be obtained along with making it possible to diminish Barkhausen noise.

The track width Tw should be narrowed in order to comply with the requirement for high recording density. However, it is difficult in the conventional production process to pattern the width dimension of the multi-layer film so as to be approximately the same width as the track width Tw.

In the present invention, however, the production process is made much more easier since the width dimension of the multi-layer film is patterned so as to be longer than the track width Tw.

Since only the order of the production steps was changed in the manufacturing method according to the present invention, troubles that the production process becomes more complicated than the conventional process or the production cost is increased can be avoided.

DESCRIPTION OF THE PREFERRED EMBODIMENT

Figure 1:
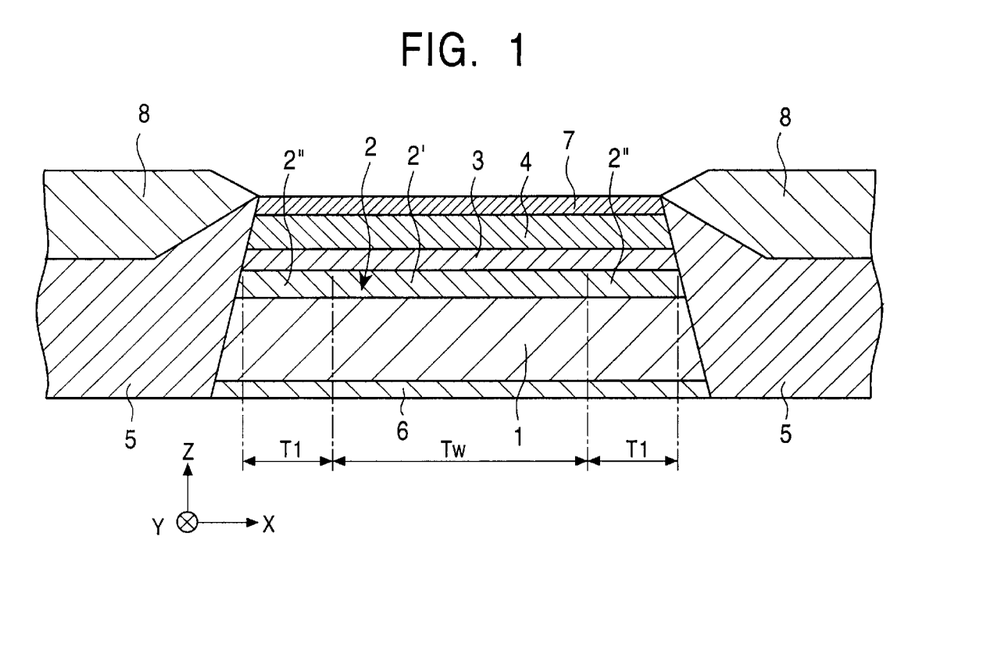
FIG. 1 is a partial cross section showing the structure of the spin-valve type thin film element according to the first embodiment of the present invention.

FIG. 1 is a cross section of the structure of the spin-valve type thin film element according to the first embodiment of the present invention viewed along the ABS surface side. Only the central portion of the element extending along the X-direction is shown by a broken line in FIG. 1.

This spin-valve type thin film element is mounted at the end of the trailing side of a floating type slider provided at a hard disk device for sensing recording magnetic field of, for example, a hard disk. The scanning direction of the recording medium such as a hard desk is along the Z-direction while the direction of the leakage magnetic field from the magnetic recording medium is along the Y-direction.

An underlayer 6 formed of a non-magnetic material such as Ta is formed at the lowest bottom in FIG. 1. An anti-ferromagnetic layer 1, a pinned magnetic layer 2, a non-magnetic conductive layer 3 and a free magnetic layer 4 are layered on this underlayer 6. A protective layer 7 made of, for example, Ta (tantalum) is formed on the free magnetic layer 4.

The pinned magnetic layer 2 is formed in direct contact with the anti-ferromagnetic layer 1 generating an exchange anisotropic magnetic field at the interface between the anti-ferromagnetic layer 1 and pinned magnetic layer 2 due to exchange coupling by annealing the pinned magnetic layer in a magnetic field, thereby magnetization of the pinned magnetic layer 2 being fixed along a proper direction by being put into a single magnetic domain state.

The anti-ferromagnetic layer 1 is formed of a Pt—Mn (platinum-manganese) alloy film in the present invention.

The Pt—Mn alloy film has excellent characteristics as an anti-ferromagnetic material in that it has a superior heat resistance to the Fe—Mn alloy conventionally used for the anti-ferromagnetic layer along with being high in the blocking temperature and being large in the excahnge anisotropic magnetic field. When the Pt—Mn alloy film is used for the anti-ferromagnetic layer 1, no exchange anisotropic magnetic field is generated at the interface with the pinned magnetic layer 2 in the step prior to subjecting to an annealing treatment, meaning that the exchange anisotropic magnetic field is generated at the interface with the pinned magnetic layer 2 only after annealing.

A Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr or Co) may be used for the anti-ferromagnetic layer 1 instead of the Pt—Mn alloy in the present invention.

The pinned magnetic layer 2 and free magnetic layer 4 is formed of a Ni—Fe (nickel-iron) alloy, Co (cobalt), Fe—Co (iron-cobalt) alloy and Fe—Co—Ni alloy while the non-magnetic conductive layer 3 is formed of a non-magnetic conductive material having a low electric resistance such as Cu (copper).

As shown in FIG. 1, hard bias layers 5, 5 are formed on both sides of the six layers from the underlayer 6 to the protective layer 7 while conductive layers 8, 8 are formed on the hard bias layers 5, 5.

The hard bias layers 5, 5 are formed of, for example, a Co—Pt (cobalt-platinum) layer or a Co—Cr—Pt (cobalt-chromium-platinum) alloy while the conductive layer 8, 8 are formed of Cu (copper) or W (tungsten).

The hard bias layers 5, 5 are magnetized along the X-direction, magnetization of the free magnetic layer 4 being aligned along the X-direction shown in the drawing due to the bias magnetic field along the X-direction from the hard bias layers 5, 5.

Figure 2:
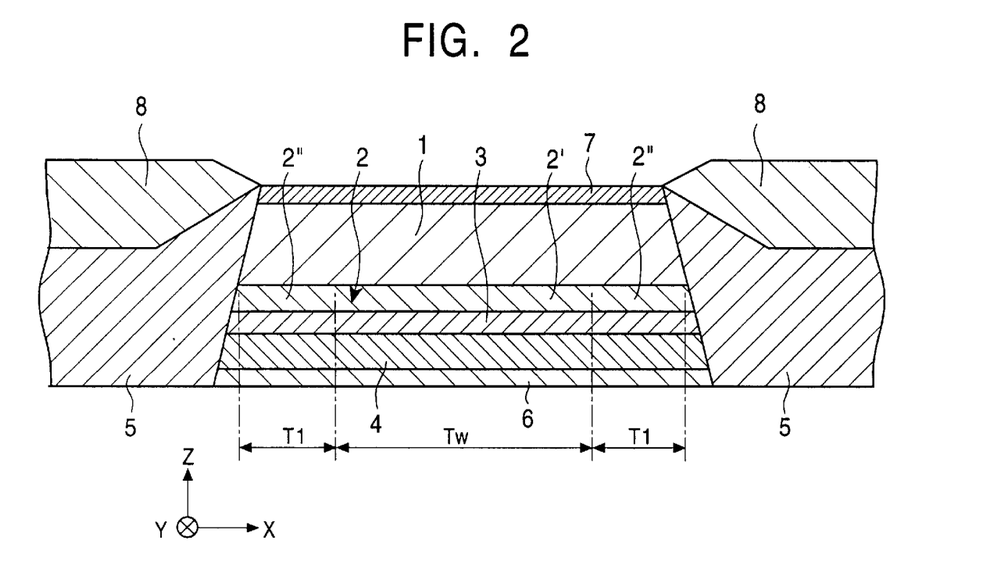
FIG. 2 is a partial cross section showing the structure of the spin-valve type thin film element according to the second embodiment of the present invention.

FIG. 2 is a cross section of the spin-valve type thin film element according to the second embodiment of the present invention viewed along the ABS surface side.

The spun-vale type thin film element shown in FIG. 2 has an inverse order of lamination to that of the spun-vale type thin film element shown in FIG. 2. In other word, a free magnetic layer 4, a non-magnetic conductive layer 3, a pinned magnetic layer 2 and an anti-ferromagnetic layer 1 are successively layered on the underlayer 6 in this order.

The free magnetic layer 4 of the spin-valve type thin layer element shown in FIG. 2 is positioned in adjoining relation to the portion of the hard bias layers 5, 5 having a larger film thickness because the free magnetic layer is formed downward of the anti-ferromagnetic layer 1, thereby making it easy to align magnetization of the free magnetic layer 4 along the X-direction.

The anti-ferromagnetic layer 1 shown in FIG. 2 is formed, like the anti-ferromagnetic layer 1 shown in FIG. 1, of a Pt—Mn alloy, Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr and Co). It is possible to generate an exchange anisotropic magnetic field at the interface by using these materials for the anti-ferromagnetic material even when the pinned magnetic layer is formed either on or under the anti-ferromagnetic layer.

Although the width dimensions of the four layers of the anti-ferromagnetic layer 10, pinned magnetic layer 11, non-magnetic conductive layer 3 and free magnetic layer 12 are formed in the prior art with approximately the same dimension as the track width Tw as shown in FIG. 6, the four layers of the antiferromagnetic layer 1, the width dimensions of the pinned magnetic layer 2, non-magnetic conductive layer 3 and free magnetic layer 4 are formed longer than the track width Tw as shown in FIG. 1 and FIG. 2 in the present invention. Accordingly, a track width region 2' having approximately the same width dimension as the track width Tw and a dead region 2" positioned at both sides of the track width region 2' and having an width dimension of T1 are formed on the pinned magnetic layer 2 as shown in FIG. 1 and FIG. 2.

FIG. 3 is an illustrative drawing showing the magnetization state of the track width region 2' and dead region 2" on the pinned magnetic layer 2. The pinned magnetic layer 2 and hard vias layers 5, 5 are viewed from just above them.

Magnetization E of the dead region 2" positioned at both sides of the track width region 2' of the pinned magnetic layer 2 is fixed along the X-direction (the track width direction) shown in the drawing by being put into a single magnetic domain state.

The order of the conventional manufacturing steps should be reversed for fixing magnetization E of the dead region 2" along the X-direction shown in the drawing, which will be described hereinafter.

Magnetization F in the close vicinity of the interface between the dead region 2" and track width region 2' is also fixed along the X-direction tilted toward the Y-direction by being put into a single magnetic domain state as shown in FIG. 3.

Although a region where magnetization is inclined is generated in the present invention as in the prior art, the width of this region is extremely narrowed as compared with the width in the conventional art (see FIG. 7). Moreover, magnetization D in the almost entire region of the track width region 2' is properly fixed along the Y-direction (the leakage magnetic field direction from the recording medium; the height direction) by being put into a single domain state as shown in FIG. 3.

As hitherto described, it is evident that magnetization at both ends (dead region 2") of the pinned magnetic layer 2 is fixed along the X-direction shown in the drawing and magnetization is suddenly risen toward the Y-direction in the region from both ends to the center (the track width region 2') in the present invention.

Figure 4:
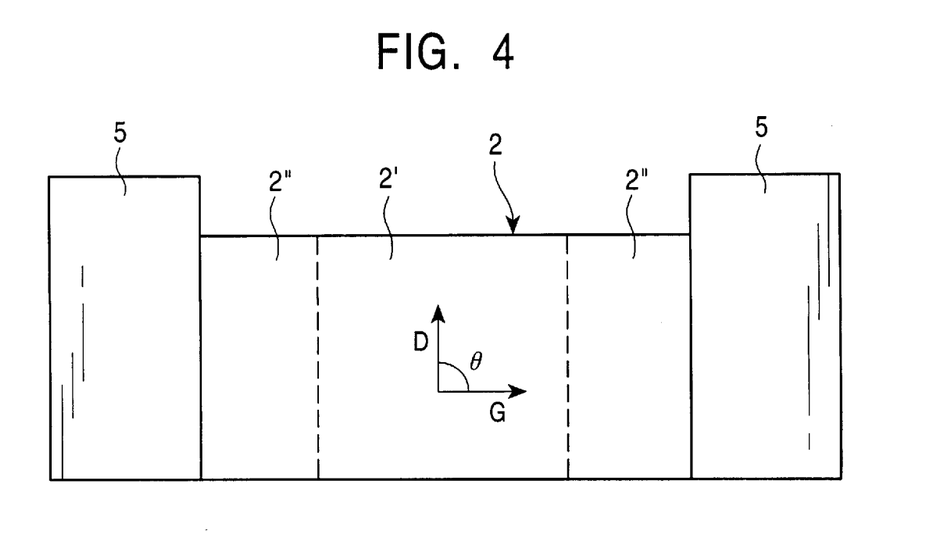
FIG. 4 is an illustrative drawing indicating the relative angle θ between magnetization of the pinned magnetic layer and magnetization of the free magnetic layer shown in FIG. 3.

As hitherto described, the relative angle between magnetization D of the track width region 2' and magnetization D of the free magnetic layer 4 confronting the track width region 2' can be set to an angle to 90° or to an angle close to 90° as shown in FIG. 4, because magnetization in the almost entire region of the track width region 2' of the pinned magnetic layer 2 is able to be fixed along the Y-direction shown in the drawing in the present invention.

Figure 5:
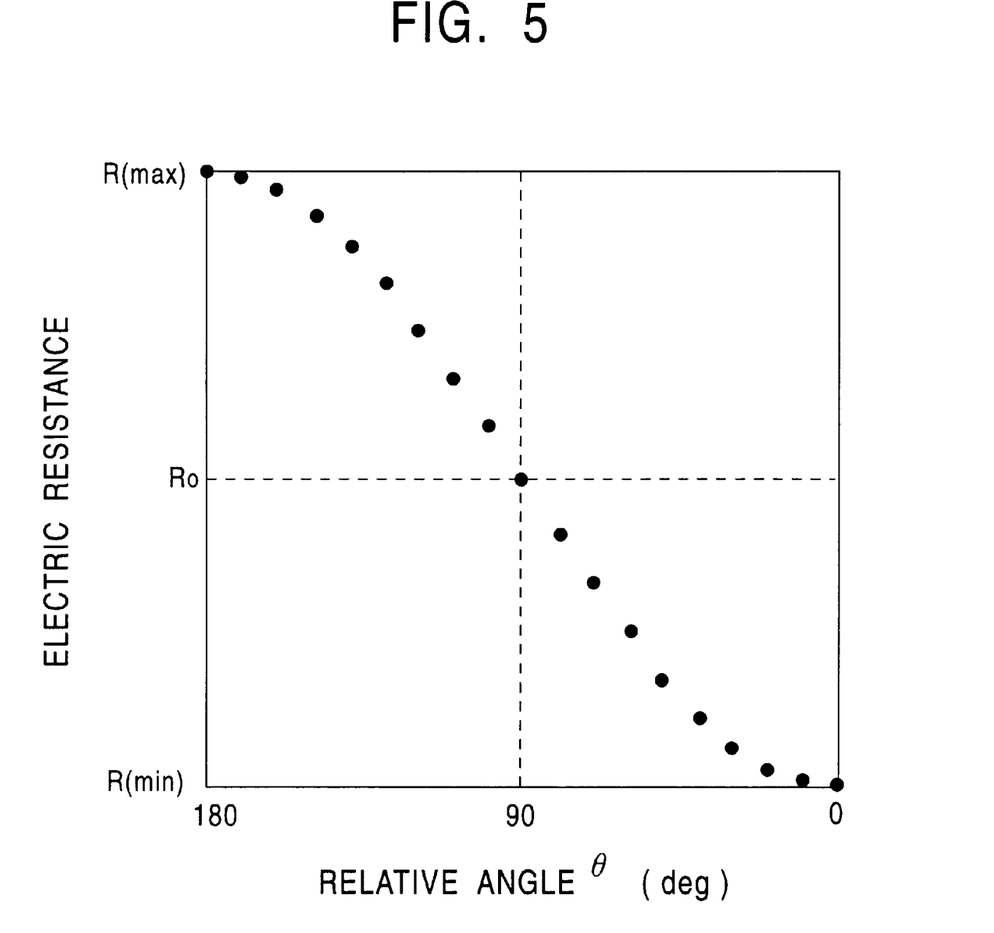
FIG. 5 is a graph indicating the relation between the relative angle θ shown in FIG. 4 and electric resistance of the spin-valve type thin film element.

Magnetization E of the dead region 2" positioned at both sides of the pinned magnetic layer 2 shown in FIG. 3 is fixed along the X-direction shown in the drawing by being put into a single magnetic domain state to obtain proper output signals only from the track width region by making few reproduction output signals to be discharged from the regions except the track width region. The relation of the relative angle θ between magnetization of the pinned magnetic layer 2 and magnetization of the free magnetic layer 4 to the reproduction sensitivity will be described hereinafter referring FIG. 5. FIG. 5 is a graph showing the relation between the relative angle θ and electric resistance of the spin-valve type thin film element.

While obtaining a large rate of variation of the electric resistance is required for improving the reproduction sensitivity of the spin-valve type thin film element, it is most preferable to adjust the relative angle θ between magnetization of the pinned magnetic layer 2 and magnetization of the free magnetic layer 4 to 90° for the purpose described above.

Since the electric resistance is represented by a Cos θ curve with a largest slope at a relative angle of 90°, adjusting the relative angle θ to 90° makes it possible to obtain a largest resistance variation rate.

Conversely, the relative angle between the pinned magnetic layer 2 and free magnetic layer 4 may be set to 0° or 180° in order to obtain a smallest resistance variation rate.

The reproduction sensitivity at the dead region 2" is made to be very dull because the relative angle between magnetization E of the dead region 2" of the pinned magnetic layer 2 and magnetization of free magnetic layer 4 is set to 0°, making it possible to substantially obtain regeneration output signals only from the track width region in the present invention.

Because the relative angle between magnetization of the pinned magnetic layer 2 in the track width region and magnetization of the free magnetic layer 4 is set to approximately zero as described previously, a desirable micro-track asymmetry can be obtained in the almost entire region of the track region in the present invention along with making it possible to reduce Barkhausen noise.

Since narrowing the track width Tw of the spin-valve type thin film element is required in order to comply with high recording density in recent years, it is very difficult for the manufacturing process to pattern the multi-layer film ranging from the anti-ferromagnetic layer 12 to the free magnetic layer 10 as in the prior art (see FIG. 6) so that the width dimension becomes nearly equal to the track width Tw.

On the contrary, it is made possible in the present invention to comply with the requirement to narrow the track width Tw using a patterning process with a certain degree of precision, since the layers are patterned by adjusting the width dimension of the multi-layer film longer than the track width Tw.

Meanwhile, it is preferable that the width dimension of the dead region 2" T1 of the pinned magnetic layer 2 shown in FIG. 1 or FIG. 3 is about 0.5 µm. When the width dimension T1 is too small, magnetization D of the track region 2' is inclined by being affected by the hard bias layers 5, 5, deteriorating micro-track asymmetry.

When the width dimension of the dead region 2" T1 is too large, on the other hand, not only magnetization E fixed along the track width direction but also inclined magnetization F and magnetization D fixed along the Y-direction are included in the dead region 2", substantially enlarging the track width Tw.

Since it is preferable as hitherto described that the width dimension of the dead region 2" T1 is about 0.5 µm, the width dimension of the pinned magnetic layer 2 may be determined by adding 1.0 µm to the track width Tw.

The method for manufacturing the spin-valve type thin film element according to the present invention will be described hereinafter. Only a part of the order of the conventional manufacturing process was changed in the manufacturing method according to the present invention.

Firstly, the anti-ferromagnetic layer 1, pinned magnetic layer 2, non-magnetic conductive layer 3 and free magnetic layer 4 are successively layered on the substrate as shown in FIG. 1 to form a multi-layer film, or the free magnetic layer 4, non-magnetic conductive layer 3, pinned magnetic layer 2 and anti-ferromagnetic layer 1 are successively layered on the substrate to form a multi-layer film.

Preferably, the anti-ferromagnetic layer 1 is formed of a Pt—Mn alloy, Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr and Co) in the present invention.

Once the anti-ferromagnetic layer is formed with these anti-ferromagnetic materials, an exchange anisotropic magnetic field can be obtained in the interface between the anti-ferromagnetic layer 1 and pinned magnetic layer 2 only when the layer has been annealed in the magnetic field.

As shown in FIG. 1 and FIG. 2, the multi-layer film is then patterned so that the width dimension of the multi-layer film becomes longer than the track width Tw, thereby a track width region 2' having approximately the same width dimension as the track width Tw and a dead region 2" positioned at both sides of the track width region 2' and having an width dimension of T1 are formed on the pinned magnetic layer 2.

It is preferable as hitherto described that the dead region 2" is formed with a the track width Tw of about 0.5 µm.

The hard bias layers 5, 5 are formed in the next step on both sides of the patterned multi-layer film, the hard vias layers 5, 5 are then magnetized along the X-direction (the track width direction) shown in the drawing.

Magnetization of the hard bias layers 5, 5 allows magnetization at both ends (the dead region) of the pinned magnetic layer 2 and free magnetic layer 4 in adjoining relation to the hard bias layers 5, 5 to be tightly aligned along the X-direction.

Magnetization at the center (the track width region) of the pinned magnetic layer 2 and free magnetic layer 4 experiences an weak effect by the bias magnetic filed, on the other hand, accordingly alignment of magnetization at the track region of the pinned magnetic layer 2 and free magnetic layer 4 being weak.

Then, the element is annealed in a magnetic field along the Y-direction (the leakage magnetic field direction from the recording medium; the height direction) shown in the drawing. Annealing in the magnetic field makes an exchange anisotropic magnetic field to be generated at the interface between the anti-ferromagnetic layer 1 and pinned magnetic layer 2.

As shown in FIG. 3, magnetization D in the track width region 2' of the pinned magnetic layer 2 is fixed along the Y-direction shown in the drawing by being put into a single magnetic domain state when the element is annealed in the magnetic field, because the track width region 2', being in spaced apart relation to the hard bias layer 5, is affected more strongly by the magnetic field along the Y-direction than by the bias magnetic field along the X-direction from the hard bias layer 5. Accordingly, the exchange anisotropic magnetic field generated at the interface between the anti-ferromagnetic layer 1 and the track width region 2' of the pinned magnetic layer is directed along the Y-direction shown in the drawing, magnetization D in the track width region 2' being fixed along the Y-direction shown in the drawing by being put into a single magnetic domain state.

As shown in FIG. 3, on the other hand, magnetization E in the dead region 2" of the pinned magnetic field 2 is fixed along the X-direction shown in the drawing by being put into a single magnetic domain state. Since magnetization E of the dead region 2" being strongly affected by the bias magnetic field of the hard bias layer 5 is tightly aligned along the X-direction shown in the drawing at the step when the hard bias layer 5 is formed and magnetized as described above, the exchange anisotropic magnetic field generated at the interface between the dead region 2" and anti-ferromagnetic layer 1 is directed along the X-direction shown in the drawing by applying an annealing treatment, magnetization E in the dead region 2" being tightly fixed along the X-direction by being put into a single magnetic domain state.

Magnetization F in the vicinity of the interface between the track region 2' of the pinned magnetic layer 2 and dead region 2" is fixed along the direction being a little inclined toward the X-direction against the Y-direction shown in the drawing because the magnetization is affected by the bias magnetic field along the X-direction from the hard bias layer 5 in approximately the same degree from the magnetic field along the Y-direction.

Because magnetization E at both ends (the dead region 2") is fixed approximately along the X-direction shown in the drawing by being put into a single magnetic domain state as described previously in the present invention, it is supposed that the region whose magnetization is substantially inclined is made very narrow compared with the prior art.

In the example of the prior art shown in FIG. 7, all magnetization in the pinned magnetic layer 3 is once fixed along the Y-direction by being annealed in the magnetic field. However, magnetization at both ends of the pinned magnetic field 3 is forced to incline from the Y-direction to the X-direction and is fixed while remaining to be inclined due to film formation and magnetization of the hard bias layer 5 carried out thereafter.

In the present invention, on the contrary, the hard bias layer 5 is at first formed and magnetized prior to the step for generating an exchange anisotropic magnetic field at the interface between the ferromagnetic layer 1 and pinned magnetic layer 2, thus tightly aligning magnetization E at both ends of the pinned layer 2 (the dead region 2"). When the element is annealed in a magnetic field along the Y-direction, magnetization E at both ends of the pinned layer 2 (the dead region 2") is affected by the magnetic field along the Y-direction. However, since the ferromagnetic coupling with the hard bias layer 5 is stronger than the effect of the magnetic field described above, the magnetization is tightly aligned along the X-direction by being put into a single magnetic domain state by the exchange anisotropic magnetic field while maintaining the magnetization E to be aligned along the X-direction.

Because magnetization at both ends of the pinned magnetic layer 2 (the dead region 2") is fixed approximately along the X-direction shown in the drawing by being put into a single magnetic domain state in the present invention, it is made possible to more reduce the proportion of the area where magnetization is inclined than in the prior art.

According to the manufacturing method of the present invention, it is possible to fix magnetization D in the track width region 2' of the pinned magnetic layer 2 approximately along the Y-direction along with fixing magnetization E of the dead region 2" positioned at both sides of the track width region 2' approximately along the X-direction.

In other words, it is possible to set the relative angle between magnetization of the pinned magnetic layer 2 in the track width region and magnetization of the free magnetic layer 4 to about 90°, as well as setting the relative angle between magnetization of the pinned magnetic layer 2 in the region other than the track width region (the dead region) and magnetization of the free magnetic layer 4 to 0°.

Accordingly, it is possible in the present invention to make reproduction sensitivity in the region other than the track width region dull, obtaining good reproduction output signals from only the track region. Moreover, since the relative angle between magnetization of the pinned magnetic layer 2 in the track width region and magnetization of the free magnetic layer 4 can be set to about 90°, proper micro-track asymmetry can be obtained along with reducing Barkhausen noise.

According to the present invention hitherto described in detail, the track width region can be formed in spaced apart relation to the bias layer by providing the dead region at both sides of the track width region of the pinned magnetic layer, enabling magnetization of the track width region to be fixed approximately along the leakage magnetic field direction from the recording medium, or along the direction to cross with the magnetization direction (track width direction) of the free magnetic layer.

Since magnetization of the dead region is fixed along the same direction as magnetization of the free magnetic layer, reproduction sensitivity at this dead region is made to be dull, enabling to obtain good reproduction output signals from only the track width region.

As hitherto described, magnetization of the pinned magnetic layer of the track width region is adjusted to cross with magnetization of the free magnetic layer besides few regeneration output signals are generated from the area other than the track width region. Therefore, proper micro-asymmetry is able to obtain along with reducing Barkhausen noise.

While it is preferable in the present invention to select anti-ferromagnetic materials that generate an exchange anisotropic magnetic field by applying a heat treatment, the Pt—Fe alloy is proposed in the present invention as an anti-ferromagnetic material disclosed herein. This Pt—Mn alloy has excellent characteristics as anti-ferromagnetic materials in that it can generate a large exchange anisotropic magnetic field, has a high blocking temperature and is excellent in corrosion resistance.

The annealing step in the magnetic field conventionally performed prior to forming and magnetizing the films was applied after forming and magnetizing the bias layer in the manufacturing method according to the present invention.

It is made possible by the manufacturing method described above to tightly align magnetization of the dead region of the pinned magnetic layer along the same direction as the magnetization direction of the free magnetic layer (the track width direction) due to the bias magnetic field of the bias layer in the step not generating the exchange anisotropic magnetic field at the interface between anti-ferromagnetic layer and pinned magnetic layer.

When the element is annealed in the conditions as described above, magnetization of the dead region can be aligned along the same direction as the magnetization direction of the free magnetic layer, making it possible to fix magnetization of the track region of the pinned magnetic layer along the direction to cross with the magnetization direction of the free magnetic layer.

In the manufacturing method according to the present invention, the production process is never made to be more complicated or the production steps are not increased as compared with the conventional production method, because only the order of the production steps was changed.

What is claimed is:

1. A spin-valve thin film element having comprising:
   an anti-ferromagnetic layer;
   a pinned magnetic layer having a track width and formed in close contact with the anti-ferromagnetic layer in which a magnetization direction of the pinned magnetic layer is fixed by an exchange anisotropic magnetic field with the anti-ferromagnetic layer;

a free magnetic layer formed over the pinned magnetic layer via a non-magnetic conductive layer;

a bias layer to align a magnetization direction of the free magnetic layer along a direction to cross with the magnetization direction of the pinned magnetic layer; and a conductive layer to impart a sense current to the pinned magnetic layer, the non-magnetic conductive layer, and the free magnetic layer, wherein said pinned magnetic includes a track width region having approximately a same width as the track width and a dead region positioned at both sides of the track width region, magnetization at the track width region being fixed along a direction to cross with the magnetization direction of said free magnetic layer and magnetization at said dead region being fixed along the magnetization direction of said free magnetic layer.

2. A spin-valve thin film element according to claim 1, wherein a width of said dead region is about 0.5 $\mu$m.

3. A spin-valve thin film element according to claim 1, wherein said anti-ferromagnetic layer is formed of a Pt—Mn alloy.

4. A spin-valve thin film element according to claim 1, wherein said anti-ferromagnetic layer is a Pd—Mn alloy, Ru—Mn alloy, Ir—Mn alloy, Os—Mn alloy, Rh—Mn alloy or Pt—Mn—alloy (X=Ni, Pd, Rh, Ru, Ir, Cr or Co).

5. A method for manufacturing a spin-valve thin film element having an anti-ferromagnetic layer, a pinned magnetic layer having a track width and formed in close contact with the anti-ferromagnetic layer in which a magnetization direction of the pinned magnetic layer is fixed by an exchange anisotropic magnetic field with the anti-ferromagnetic layer, a free magnetic layer formed over the pinned magnetic layer via a non-magnetic conductive layer, a bias layer to align a magnetization direction of the free magnetic layer along a direction to cross with the magnetization direction of the pinned magnetic layer and a conductive layer to impart a sense current to the pinned magnetic layer, non-magnetic conductive layer and the free magnetic layer, comprising:

forming a multi-layer film having the anti-ferromagnetic layer, the pinned magnetic layer, the non-magnetic conductive layer and the free magnetic layer from the bottom in order;

forming a track region including a track width region having approximately a same width as the track width of said pinned magnetic layer by patterning said multi-layer film such that a width of the multi-layer film is longer than the track width and a dead region is positioned at both sides of said track width region;

forming bias layers on both sides of said multi-layer film and magnetizing said bias layer along a track width direction; and fixing magnetization in the track width region of said pinned magnetic layer along a leakage magnetic field direction from a recording medium after annealing in a magnetic field along the leakage magnetic field direction from the recording medium, and fixing magnetization in said dead region along the track width direction.

6. A method for manufacturing a spin-valve thin film element according to claim 5, further comprising forming said anti-ferromagnetic layer of a Pt—Mn alloy.

7. A method for manufacturing a spin-valve thin film element according to claim 5, further comprising forming said anti-ferromagnetic layer from a Pd—Mn alloy, Ru—Mn alloy, Ir—Mn alloy, Os—Mn alloy, Rh—Mn alloy or Pt—Mn—alloy (X=Ni, Pd, Rh, Ru, Ir, Cr or Co).

8. A spin-valve thin film element comprising:

an anti-ferromagnetic layer;

a pinned magnetic layer having a track width and formed in close contact with the anti-ferromagnetic layer in which a magnetization direction of the pinned magnetic layer is fixed by an exchange anisotropic magnetic field with the anti-ferromagnetic layer;

a free magnetic layer formed under the pinned magnetic layer via a non-magnetic conductive layer;

a bias layer to align a magnetization direction of the free magnetic layer along a direction to cross with the magnetization direction of the pinned magnetic layer; and a conductive layer to impart a sense current to the pinned magnetic layer, the non-magnetic conductive layer and the free magnetic layer;

wherein said pinned magnetic layer includes a track width region having approximately a same width as a track width and a dead region positioned at both sides of the track width region, magnetization at the track width region being fixed along a direction to cross with the magnetization direction of said free magnetic layer and magnetization at said dead region being fixed along the magnetization direction of said free magnetic layer.

9. A spin-valve thin film element according to claim 8, a width of said dead region being about 0.5 $\mu$m.

10. A spin-valve thin film element according to claim 8, said anti-ferromagnetic layer being formed of a Pt—Mn alloy.

11. A spin-valve thin film element according to claim 8, said anti-ferromagnetic layer being a Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr or Co).

12. A method for manufacturing a spin-valve thin film element having an anti-ferromagnetic layer, a pinned magnetic layer having a track width and formed in close contact with the anti-ferromagnetic layer in which a magnetization direction of the pinned magnetic layer is fixed by an exchange anisotropic magnetic field with the anti-ferromagnetic layers free magnetic layer formed under the pinned magnetic layer via a non-magnetic conductive layer, a bias layer to align a magnetization direction of the free magnetic layer along a direction to cross with the magnetization direction of the pinned magnetic layer and a conductive layer to impart a sense current to the pinned magnetic layer, non-magnetic conductive layer and the free magnetic layer, comprising:

forming a multi-layer film having the anti-ferromagnetic layer, the pinned magnetic layer, the non-magnetic conductive layer and the free magnetic layer from the bottom in order;

forming a track region including a track width region having approximately a same width as the track width of said pinned magnetic layer by patterning said multi-layer film such that a width of the multi-layer film is longer than the track width and a dead region is positioned at both sides of said track width region;

forming bias layers on both sides of said multi-layer film and magnetizing said bias layer along a track width direction; and fixing magnetization in the track width region of said pinned magnetic layer along a leakage magnetic field direction from a recording medium after annealing in a magnetic field along the leakage magnetic field direction from the recording medium, and fixing magnetization in said dead region along the track width direction.

13. A method for manufacturing a spin-valve thin film element according to claim 12, further comprising forming said anti-ferromagnetic layer from a Pt—Mn alloy.

14. A method for manufacturing a spin-valve thin film element according to claim 12, further comprising forming said anti-ferromagnetic layer from a Pd—Mn alloy, Ru—Mn alloy, Ir—Mn alloy, Os—Mn alloy, Rh—Mn alloy or Pt—Mn—X alloy (X=Ni, Pd, Rh, Ru, Ir, Cr or Co).

* * * * *

UNITED STATES PATENT AND TRADEMARK OFFICE
CERTIFICATE OF CORRECTION

PATENT NO. : 6,150,045
DATED : November 21, 2000
INVENTOR(S) : Masamichi Saito et al.

It is certified that error appears in the above-identified patent and that said Letters Patent is hereby corrected as shown below:

Claim 1,
Line 1, delete "having".
Line 17, change "magnetic includes" to -- magnetic layer includes --.

Claim 4,
Line 4, change "Pt-Mn-alloy" to -- Pt-Mn-X alloy --.

Claim 7,
Line 5, change "Pt-Mn-alloy" to -- Pt-Mn-X alloy --.

Claim 12,
Line 7, change "layers" to -- layer, --.

Signed and Sealed this

Nineteenth Day of March, 2002

*Attest:*

JAMES E. ROGAN
*Director of the United States Patent and Trademark Office*

*Attesting Officer*